US012082383B2

(12) United States Patent
Melfried et al.

(10) Patent No.: US 12,082,383 B2
(45) Date of Patent: Sep. 3, 2024

(54) ELECTRONIC DEVICE FOR A VEHICLE

(71) Applicant: Aptiv Technologies AG, Schaffhausen (CH)

(72) Inventors: Sebastian Melfried, Cracow (PL); Maciej Barszczowski, Bielsko-Biala (PL)

(73) Assignee: APTIV TECHNOLOGIES AG, Schaffhausen (CH)

( * ) Notice: Subject to any disclaimer, the term of this patent is extended or adjusted under 35 U.S.C. 154(b) by 402 days.

(21) Appl. No.: 17/513,765

(22) Filed: Oct. 28, 2021

(65) Prior Publication Data
US 2022/0142019 A1    May 5, 2022

(30) Foreign Application Priority Data

Oct. 30, 2020 (GB) .................................. 2017238
Oct. 15, 2021 (EP) .................................. 21203026

(51) Int. Cl.
*H05K 9/00* (2006.01)
*B60R 16/02* (2006.01)
(Continued)

(52) U.S. Cl.
CPC ........... *H05K 9/0028* (2013.01); *B60R 16/02* (2013.01); *H05K 5/006* (2013.01); *H05K 7/1402* (2013.01);
(Continued)

(58) Field of Classification Search
CPC .... H05K 9/0028; H05K 5/006; H05K 7/1402; H05K 2201/09854; H05K 2201/10371
(Continued)

(56) References Cited

U.S. PATENT DOCUMENTS 5,014,160 A     5/1991   McCoy
5,353,201 A    10/1994   Maeda
(Continued)

FOREIGN PATENT DOCUMENTS

DE        19505125      8/2004
DE      102005036300    6/2010
(Continued)

OTHER PUBLICATIONS

"Combined Search and Examination Report", GB Application No. 2017238.3, Mar. 31, 2021, 5 pages.
(Continued)

*Primary Examiner* — Zhengfu J Feng
(74) *Attorney, Agent, or Firm* — Harness, Dickey & Pierce, P.L.C.

(57) ABSTRACT

Electronic device such as a camera for a vehicle, including: a supporting frame, a main electronic substrate, provided with at least one electric or electronic component or circuit and coupled to the supporting frame; a secondary electronic substrate, provided with at least one electric or electronic component or circuit and coupled to the supporting frame; wherein the supporting frame has at least one main projecting tab and at least one secondary projecting tab, each capable to occupy a non-twisted position or a twisted position, wherein the main projecting tab, when in the twisted position, is providing an attachment of the main electronic substrate to the supporting frame, and wherein the secondary projecting tab, when in the twisted position, is providing an attachment of the secondary electronic substrate to the supporting frame.

19 Claims, 3 Drawing Sheets

(51) Int. Cl.
  *H05K 5/00* (2006.01)
  *H05K 7/14* (2006.01)
(52) U.S. Cl.
  CPC .............. *H05K 2201/09854* (2013.01); *H05K 2201/10371* (2013.01)
(58) Field of Classification Search
  USPC .................................................... 361/679.01
  See application file for complete search history.

(56) References Cited

U.S. PATENT DOCUMENTS

| | | | | |
|---|---|---|---|---|
| 6,186,800 | B1 * | 2/2001 | Klein | H05K 9/0039 |
| | | | | 439/95 |
| 6,191,950 | B1 | 2/2001 | Cox et al. | |
| 6,687,135 | B1 | 2/2004 | Kitade | |
| 10,958,815 | B1 * | 3/2021 | Chen | H05K 1/189 |
| 2002/0101041 | A1 * | 8/2002 | Kameyama | H01R 13/521 |
| | | | | 277/628 |
| 2002/0142627 | A1 * | 10/2002 | Kameyama | H05K 3/325 |
| | | | | 439/67 |
| 2003/0230616 | A1 * | 12/2003 | Kobayashi | H05K 7/142 |
| | | | | 225/93 |
| 2010/0276948 | A1 | 11/2010 | Shih et al. | |
| 2018/0188474 | A1 * | 7/2018 | Enta | H04N 23/00 |
| 2018/0231736 | A1 * | 8/2018 | Flugge | G03B 17/12 |

FOREIGN PATENT DOCUMENTS

| | | |
|---|---|---|
| DE | 102014212762 | 1/2016 |
| EP | 1033776 | 9/2000 |
| JP | 2002100847 | 4/2002 |
| WO | 2011018825 | 2/2011 |

OTHER PUBLICATIONS

"Extended European Search Report", EP Application No. 21203026.6, Mar. 29, 2022, 8 pages.

* cited by examiner

ELECTRONIC DEVICE FOR A VEHICLE

CROSS-REFERENCE TO RELATED APPLICATIONS

This application claims priority to European Patent Application Number 21203026.6, filed Oct. 15, 2021 and United Kingdom Patent Application No. 2017238.3, filed Oct. 30, 2020, the disclosures of which are hereby incorporated by reference in their entireties herein.

BACKGROUND

Typically, the internal components of an electronic device can be screwed together, but this requires high precision tooling (small dimensions, small torques . . . ), for implementing time consuming assembly steps.

It is also known to provide elastic or snap fit couplings, as disclosed in documents DE102014212762 A1 or U.S. Pat. No. 5,353,201A. However, the solution disclosed in these documents may not be suitable to provide reliable coupling for thin, flexible, low resistance or fragile parts, such as electronic substrate(s) (typically printed circuit boards, with a rigid frame or with flexible film substrate)

The present disclosure improves the situation with the above-mentioned drawbacks. In particular, a purpose of the present disclosure is to provide an electronic device having components designed to achieve a fast, reliable, and low-cost assembly.

SUMMARY

The present disclosure relates to the field of the electronic devices, and in particular in the field of the electronic devices including several parts such as one or several electronic substrate(s) (typically printed circuit boards), supporting frames, cover parts which need to be assembled before integration into a vehicle. Such an electronic device can be for example a camera (in the visible field, or in the infrared field) used for example in a vehicle.

The present disclosure relates to an electronic device such as a camera for a vehicle, including: a supporting frame, a main electronic substrate, provided with at least one electric or electronic component or circuit and coupled to the supporting frame; wherein the supporting frame has at least one main projecting tab, capable to occupy a non-twisted position or a twisted position, and wherein the main projecting tab, when in the twisted position, attaches the main electronic substrate to the supporting frame.

The electronic device according to the above embodiment includes a supporting frame with projecting tabs which can be bent to provide the attachment of the electronic substrates. Therefore, the assembly does not require any screw, thus simplifying the manufacturing. In addition, the projecting tab, when in the non-twisted position, provides a visual indication that the attachment is not finished.

According to an embodiment, the electronic device includes: a secondary electronic substrate, provided with at least one electric or electronic component or circuit and coupled to the supporting frame; wherein the supporting frame has at least one secondary projecting tab, capable to occupy a non-twisted position or a twisted position, and wherein the secondary projecting tab, when in the twisted position, attaches the secondary electronic substrate to the supporting frame.

According to an embodiment: the main electronic substrate is defining a first plane; the secondary electronic substrate is defining a second plane; and the second plane is distinct from the first plane, preferably the second plane and the first plane are intersecting planes, and preferably the second plane and the first plane are perpendicular planes.

Complex shapes can be provided with the above embodiment (perpendicular electronic substrates), but the assembly is less complicated compared to the case of the prior art where the attachment is provided by screws with several different directions of screwing. In the present case, the attachment is easily provided by bending the main and secondary projecting tabs.

According to an embodiment the electronic device includes a main cover part, and said at least one of the main projecting tab: when in the non-twisted position, is interfering with the main cover part, so as to prevent an assembly operation of the main cover part to the electronic device; when in the twisted position, is not interfering with the main cover part, so as to allow an assembly operation of the main cover part to the electronic device.

The main projecting tabs according to the above embodiment are used as mistake-proofing or poka-yoke. Indeed, if one of the main projecting tabs is/are not bent or twisted, the further assembly of the main cover part is not possible.

According to an embodiment, the main cover part is coupled to the supporting frame, preferably in a sliding arrangement.

According to an embodiment the electronic device includes at least one elastic leg, wherein the main cover part is locked to the supporting frame in a final position by the elastic leg.

According to an embodiment the electronic device includes a secondary cover part, and at least one of the main projecting tab and the secondary projecting tab: when in the non-twisted position, is interfering with the secondary cover part, so as to prevent an assembly operation of the secondary cover part to the electronic device; when in the twisted position, is not interfering with the secondary cover part, so as to allow an assembly operation of the secondary cover part to the electronic device, or wherein said at least one of the secondary projecting tab: when in the non-twisted position, is interfering with the main cover part, so as to prevent an assembly operation of the main cover part to the electronic device; when in the twisted position, is not interfering with the main cover part, so as to allow an assembly operation of the main cover part to the electronic device.

The main and/or secondary projecting tabs according to the above embodiment are used as mistake-proofing or poka-yoke. Indeed, if one of the main and/or secondary projecting tabs is/are not bent or twisted, the further assembly of the secondary cover part is not possible, or the secondary projecting tabs according to the above embodiment can be used as mistake-proofing or poka-yoke for the main cover part.

According to an embodiment the secondary cover part includes a decorative cover part and a window preferably made of an infra red transparent material.

According to an embodiment the electronic device includes a conductive paste strand at least in contact with the main electronic substrate and/or the secondary electronic substrate. Such conductive paste strand is providing effective electro-magnetic radiation protection.

According to an embodiment, the main electronic substrate has a main through hole and/or the secondary electronic substrate has a secondary through hole, the main projecting tab is passing through the main through hole and/or the secondary projecting tab is passing through the secondary through hole, and the conductive paste strand has a portion surrounding the main through hole and/or the secondary through hole. The contact of the conductive paste strand is ensured/enhanced around the through hole by the bending of the projecting tab onto the electronic substrate, even if the latter presents a high flexibility.

According to an embodiment, the main projecting tab or the secondary projecting tab presents a twisted length over the main electronic substrate, and the conductive paste strand has a portion located from the main through hole and/or the secondary through hole at a distance less than the twisted length.

According to an embodiment, the conductive paste strand has a portion located from the main through hole and/or the secondary through hole by less than 20 mm.

According to an embodiment, the conductive paste strand has a portion surrounding the main electronic substrate and/or the secondary electronic substrate.

According to an embodiment, the supporting frame is a metallic part.

According to an embodiment: the attachment of the main electronic substrate to the supporting frame is solely or exclusively provided by the main projecting tab in the twisted position, the attachment of the secondary electronic substrate to the supporting frame is solely or exclusively provided by the secondary projecting tab in the twisted position In other words, the disclosure relates to an electronic device such as a camera for a vehicle, including: a main electronic substrate, provided with at least one electric or electronic component or circuit; a supporting frame, coupled to the main electronic substrate, a main cover part, covering at least partially the main electronic substrate, characterized in that: the supporting frame has at least one main projecting tab capable to occupy a non-twisted position or a twisted position, wherein the main projecting tab, when in the twisted position, is providing an attachment of the main electronic substrate to the supporting frame, and wherein the main projecting tab, when in the non-twisted position, is interfering with the main cover part so as to prevent an assembly operation of the main cover part to the electronic device.

According to an embodiment, the electronic device includes a secondary electronic substrate provided with at least one electric or electronic component or circuit; wherein the supporting frame has at least one secondary projecting tab capable to occupy a non-twisted position or a twisted position, wherein the secondary projecting tab, when in the twisted position, is providing an attachment of the secondary electronic substrate to the supporting frame, According to an embodiment, the secondary projecting tab, when in the non-twisted position, is interfering with the main cover part so as to prevent the assembly of the main cover part to the electronic device.

According to an embodiment, the electronic device includes a secondary cover part covering at least partially the secondary electronic substrate, wherein the secondary projecting tab, when in the non-twisted position, is interfering with the secondary cover part so as to prevent an assembly of the secondary cover part to the electronic device.

A third aspect of the disclosure relates to a vehicle, including an electronic device according to the first or second aspect of the disclosure.

BRIEF DESCRIPTION OF THE DRAWINGS

Other features, purposes and advantages of the disclosure will become more explicit by means of reading the detailed statement of the non-restrictive embodiments made with reference to the accompanying drawings.

DETAILED DESCRIPTION

Figure 1:
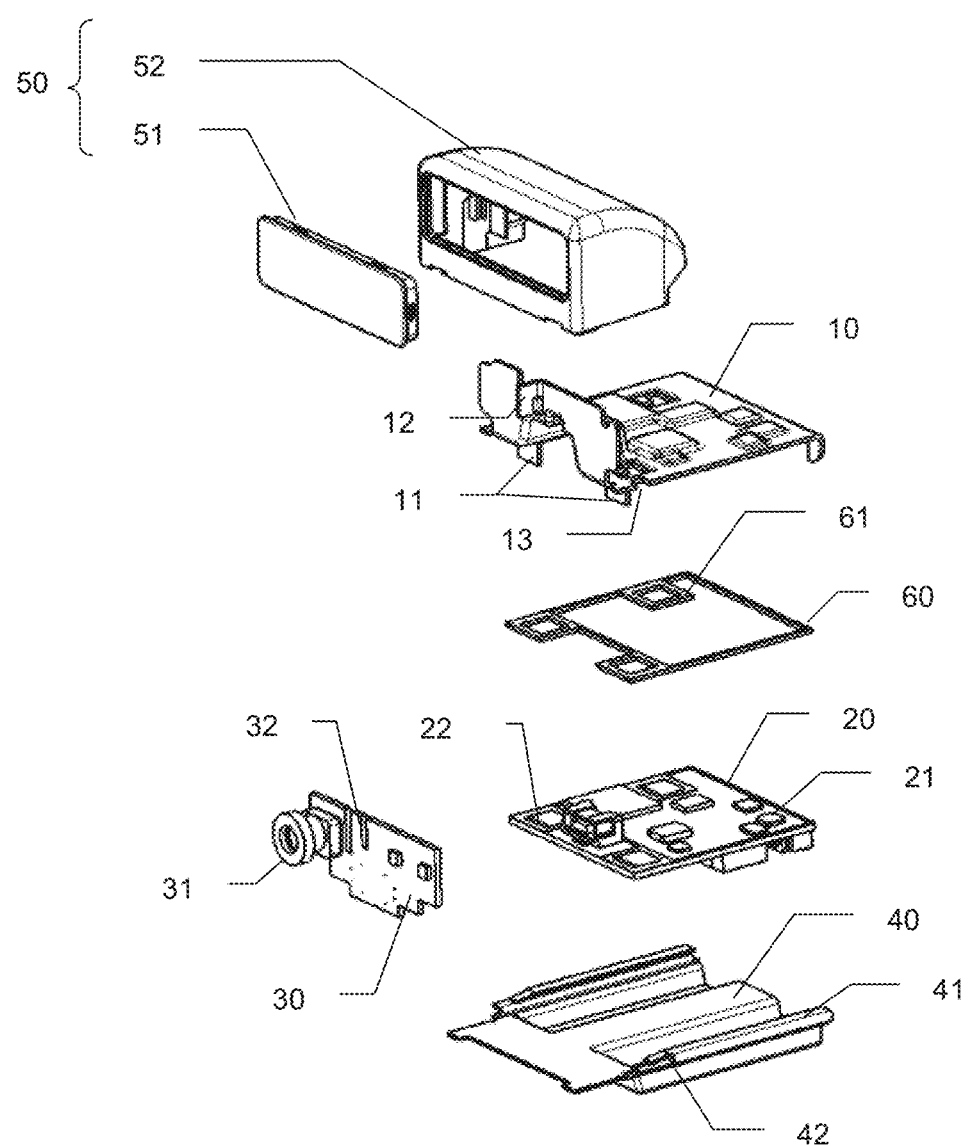
FIG. 1 shows an exploded view of an electronic device according to an embodiment of the disclosure.

FIG. 1 shows an exploded view of an electronic device (a camera, and in particular an infra-red camera), which is designed to be used in a vehicle.

The electronic device may include: a supporting frame 10; a main electronic substrate 20, a secondary electronic substrate 30, main cover 40, a secondary cover 50, a conductive paste strand 60.

In particular, it should be noted that the presence of the secondary electronic substrate 30 and/or secondary cover 50 and/or conductive paste strand 60 is(are) optional.

The supporting frame is typically a metallic part, and in the represented example, it is a metallic sheet punched, stamped and folded to present the complex three-dimensional shape shown on FIG. 1. In particular a main part of the supporting frame 10, on the right side, defines a first plane or first planar shape, and a second part of the supporting frame 10, on the left side, defines a second plane or second planar shape. In the given example, the first plane and the second plane are perpendicular.

The supporting frame 10 has main projecting tabs 11 (shown FIG. 2 as well) projecting on a downward direction from the main part or first planar shape, and has secondary projecting tab 12 projecting to the left from the second part or second planar shape.

Typically, the main projecting tabs 11 and secondary projecting tab 12 are manufactured by punching and bending steps. The supporting frame has also locking openings 13 visible FIG. 1 and FIG. 2.

The main electronic substrate 20 is typically a printed circuit board, and hoists electric or electronic components 21, and/or electric or electronic circuits. The main electronic substrate 20 of FIG. 1 might include a rigid board made of resin, such as epoxy resin. Alternatively, the main electronic substrate 20 might mainly be made of a flexible film, made of polyimide material for example.

In the present example, the main electronic substrate 20 includes an electronic control unit (ECU), to drive and control the electronic device. However, other functions and components are possible.

As shown FIG. 1, the main electronic substrate 20 has trough holes 22 or slots, for receiving the main projecting tabs, as will be discusses hereunder.

The secondary electronic substrate 30 is typically a printed circuit board, and hoists electric or electronic components 31 (an electro-optic device in the present example), and/or electric or electronic circuits. The secondary electronic substrate 30 of FIG. 1 might include a rigid board made of resin, such as epoxy resin. Alternatively, the secondary electronic substrate 30 might mainly be made of a flexible film, made of polyimide material for example.

In the present example, the secondary electronic substrate 30 includes a lens and an optic sensor, to provide a camera capable of capturing pictures from the electronic device (thus forming a camera printed circuit board or PCB). In this embodiment, the camera is an infra-red camera. However, other functions and components are possible.

As shown FIG. 1, the main secondary substrate 30 has a slot 32, for receiving the secondary projecting tabs 12, as will be discusses hereunder.

The main cover 40 is provided in this example as a sheet of metal folded to include to lateral sliding portions 41 to be assembled to the supporting frame 10 via a sliding coupling operation. Flexible legs 42 are provide at the end of the lateral sliding portions.

The secondary cover 50 includes a screen 51 and a decorative cover 52. The screen 51 is made of a material transparent to infra-red rays, and the decorative cover might be made of plastics or any other material.

The conductive paste strand 60 is shown on FIG. 1 as an independent component, but it is rather deposited onto the supporting frame 10 in a liquid or pasty state, before assembly of the main electronic substrate 20, to achieve or provide electric contact or conductivity between these two components so as to ensure an adequate electric and/or magnetic field protection. Despite not shown, the conductive paste strand 60 is or can be also provided between the secondary electronic substrate 30 and the supporting frame 10.

One should notice that the conductive paste strand 60 includes closed loops 61 located in regard to the main projected tabs 11. In summary, when the electronic device is fully assembled, the conductive paste strand 60 is sandwiched or in contact with the supporting frame 10 and the main electronic substrate 20. Typically, the conductive paste strand is a foam, or a resin or a grease or a polymeric component which has electric conductive capacity, or which is loaded with electric conductive particles.

Figure 2:
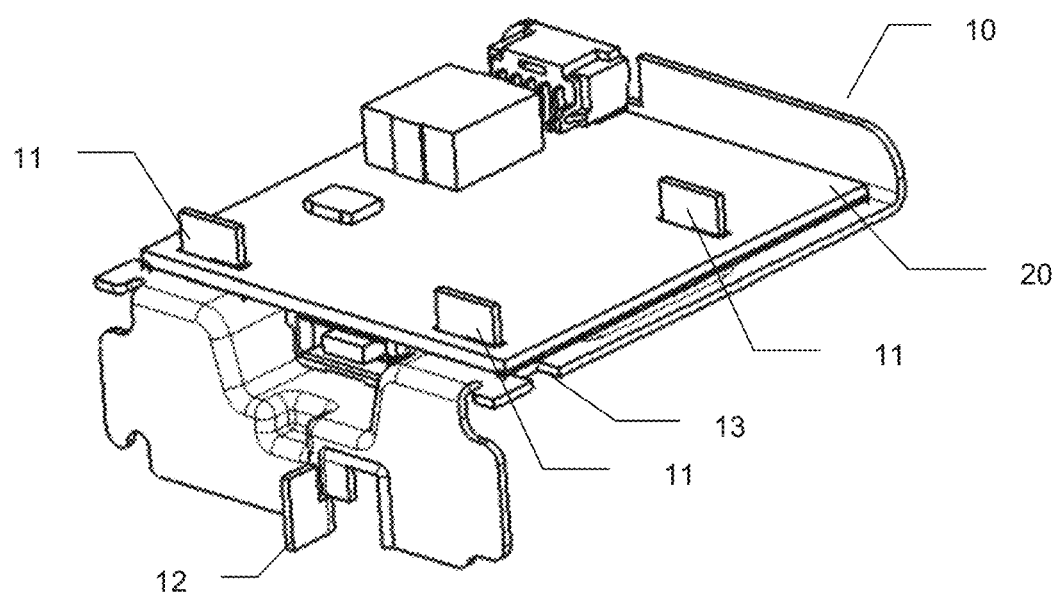
FIG. 2 shows a supporting frame and a main electronic substrate of the electronic device of FIG. 1, during a step of assembly.

FIG. 2 represents a step of the assembly of the main electronic substrate 20 onto the supporting frame 10. In detail, the main electronic substrate 20 has been positioned onto the supporting frame 10 so that the main projected tabs 11 pass through the through holes 22 of the main electronic substrate 20. Typically, the conductive paste strand 60, not visible on this FIG. 2, has already been deposited onto the supporting frame 10 or onto the main electronic substrate 20.

Figure 3:
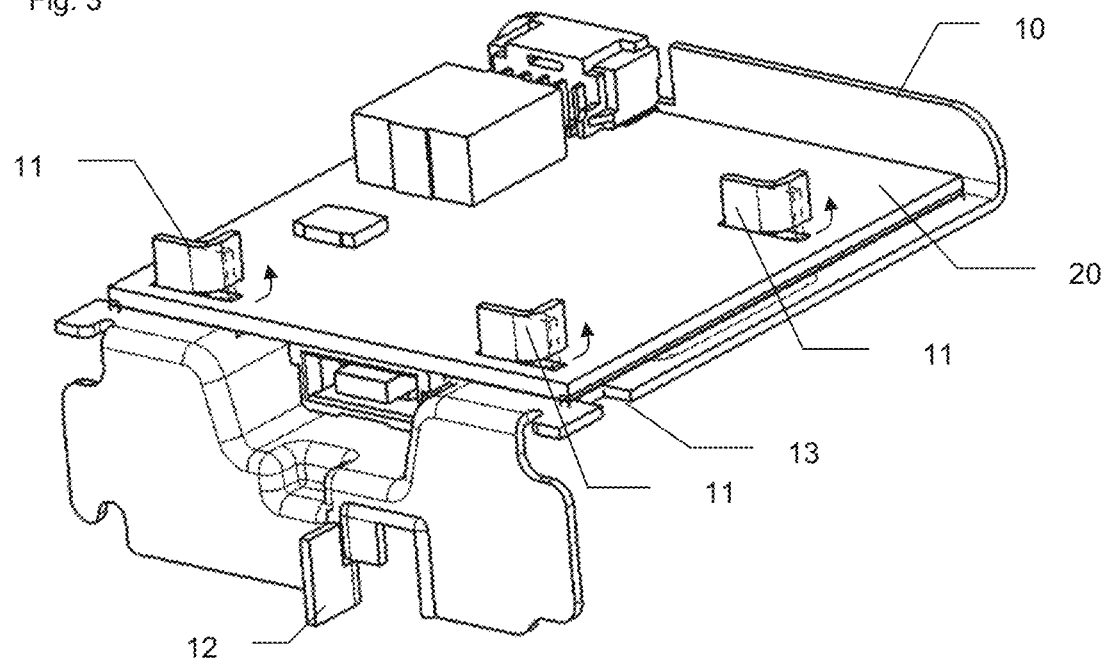
FIG. 3 shows the supporting frame and the main electronic substrate of FIG. 2, after the assembly of the main electronic substrate with the supporting frame.

As shown FIG. 3 by the arrows, the next step is to secure/attach the main electronic substrate 20 onto the supporting frame 10 by bending or twisting the main projected tabs 11. This is providing an easy and non-reversible way to attach the components together, as no screws are required. In other words, the projecting tabs 11, all shown in an initial and not bent position on FIG. 2 are all bent and twisted to occupy a final bent position, the one shown FIG. 3.

One should note that the closed loops 61 of the conductive paste strand 60 are at least partially in close vicinity of the main projected tabs 11 in the final bent position, ensuring good and reliable contact between the supporting frame 10, main electronic substrate 20 and conductive paste strand 60. In particular, at least one portion of the closed loops 61 is in regards of the bent main projecting tabs 11.

Similar assembly is provided with the secondary electronic substrate 30: it is positioned onto the supporting frame 10, the secondary projecting tab 12 passing through the slot 32, so that further bending or twisting of the secondary projecting tab 12 secure the attachment of these two components.

In summary, the bending of the main and secondary projecting tabs 11 and 12 is sufficient to achieve a reliable and full attachment of the electronic substrates to the supporting frame 10. No tooling (screwing, riveting . . . tools) are required for the operator, so that the assembly sequence is simplified.

Figure 4:
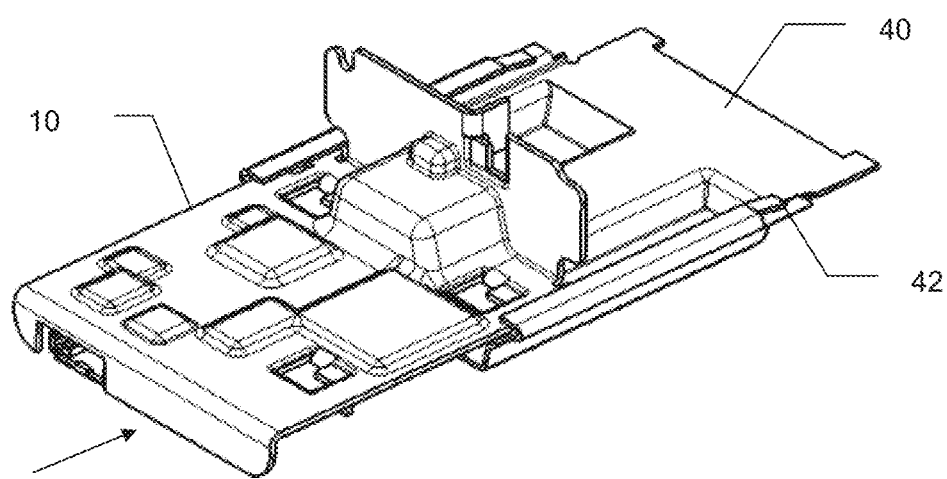
FIG. 4 shows the supporting frame and the main electronic substrate of FIG. 3, during a further step of assembly with a main cover of the electronic device of FIG. 1.

FIG. 4 represents the step of assembly of the supporting frame 10 to the main cover 40. The supporting frame 10 (coupled to the main electronic substrate 20, not visible on FIG. 4) is shown up-side down and from rear direction compared to FIG. 2, and inserted into the lateral sliding portions 41 so that the supporting frame 10 is "sled into" the main cover 40 to cover the main electronic substrate 20.

The supporting frame can be pushed as shown by the arrow on FIG. 4, until it arrives in abutment with the main cover 40, where the flexible legs 42 can engage into the locking openings 13 of the supporting frame 10, to lock the latter in the final position of assembly.

At this stage of assembly, the main projecting tabs 11 are twisted in the final and bent position. Therefore, it is possible to slide the supporting frame 10 into the final assembled position. Otherwise, if one of the projecting tabs 11 is not fully bent into the final and bent position, it would interfere or abut with the main cover 40, so that assembly of the supporting frame 10 and main cover 40 is impossible. This specific arrangement provides additional check or insurance that only a main electronic substrate 20 fully and securely assembled to the supporting frame 10 is further assembled to the main cover 40. The main projecting tabs in the initial and non-bent position act as poka yoke and render assembly of supporting frame 10 and main cover 40 impossible.

It has to be noted that same situation can be implemented for the assembly of the secondary cover 50. The secondary projecting tab 12 can be sized so that in the initial and non-bent position, any assembly of the supporting frame 10 to the secondary cover 50 is impossible, due to an interference. In the final and bent position, the secondary projecting tab 12 does not prevent or block the assembly of the supporting frame 10 to the secondary cover 50.

In summary, the projecting tabs (main or secondary) provide notably the capacity to simplify the assembly operations of the components to the supporting frame and prevent further assembly if they are not properly twisted or bent.

One should note that projecting tabs of the supporting frame could be used to attach other components than electronic substrates.

What is claimed is:

1. An apparatus comprising an electronic device including:
    a supporting frame having at least one main projecting tab that can be in a non-twisted position or a twisted position; and
    a main electronic substrate coupled to the supporting frame and provided with at least one electric or electronic component or circuit,
    the at least one main projecting tab, when in the twisted position, providing an attachment of the main electronic substrate to the supporting frame,
    wherein:
    the electronic device further comprises a main cover part, and
    the at least one main projecting tab, when in the non-twisted position, interferes with the main cover part to prevent an assembly operation of adding the main cover part to the electronic device.

2. The apparatus of claim 1, wherein the at least one main projecting tab, when in the twisted position, does not interfere with the main cover part to allow the assembly operation of adding the main cover part to the electronic device.

3. The apparatus of claim 1, wherein the main cover part is coupled to the supporting frame.

4. The apparatus of claim 1, wherein a coupling between the main cover part and the supporting frame comprise a sliding arrangement.

5. The apparatus of claim 1, wherein a coupling between the main cover part and the supporting frame comprise at least one elastic leg to lock the main cover part to the supporting frame in a final assembled position.

6. The apparatus of claim 1, wherein the electronic device further comprises:
   a secondary electronic substrate coupled to the supporting frame and provided with at least one second electric or electronic component or circuit,
   the supporting frame further having at least one secondary projecting tab that can be in a non-twisted position or a twisted position, and
   the at least one secondary projecting tab, when in its twisted position, providing an attachment of the secondary electronic substrate to the supporting frame.

7. The apparatus of claim 6, wherein:
   the main electronic substrate defines a first plane; and
   the secondary electronic substrate defines a second plane that is distinct from the first plane.

8. The apparatus of claim 7, wherein the second plane and the first plane comprise intersecting planes.

9. The apparatus of claim 7, wherein the second plane and the first plane comprise perpendicular planes.

10. The apparatus of claim 7, wherein:
    the electronic device further comprises a secondary cover part; and
    at least one of:
    when in its non-twisted position, the at least one main projecting tab interferes with the secondary cover part to prevent an assembly operation of adding the secondary cover part to the electronic device;
    when in its non-twisted position, the at least one secondary projecting tab interferes with the secondary cover part to prevent the assembly operation of adding the secondary cover part to the electronic device;
    when in its twisted position, the at least one main projecting tab does not interfere with the secondary cover part to allow the assembly operation of adding the secondary cover part to the electronic device; or
    when in its twisted position, the at least one secondary projecting tab does not interfere with the secondary cover part to allow the assembly operation of adding the secondary cover part to the electronic device.

11. The apparatus of claim 7, wherein:
    the electronic device further comprises a secondary cover part; and
    at least one of:
    when in its non-twisted position, the at least one secondary projecting tab interferes with the main cover part to prevent the assembly operation of the main cover part to the electronic device; or
    when in its twisted position, the at least one secondary projecting tab is not interfering with the main cover part to allow the assembly operation of the main cover part to the electronic device.

12. The apparatus of claim 7, wherein:
    the electronic device further comprises a secondary cover part having a decorative cover part and a window comprising a transparent material.

13. The apparatus of claim 12, wherein the window comprises a material that is transparent to infrared light.

14. The apparatus of claim 6, wherein the electronic device further comprises:
    a conductive paste strand in contact with at least one of the main electronic substrate or the secondary electronic substrate.

15. The apparatus of claim 14, wherein:
    at least one of the main electronic substrate comprises a main through hole or the secondary electronic substrate comprises a secondary through hole,
    the at least one main projecting tab passes through the main through hole or the at least one secondary projecting tab passes through the secondary through hole, and
    the conductive paste strand comprises a portion surrounding the main through hole or the secondary through hole.

16. The apparatus of claim 15,
    wherein the at least one main projecting tab or the at least one secondary projecting tab presents a twisted length over the main electronic substrate, and
    wherein the conductive paste strand comprises a second portion located from the main through hole or the secondary through hole at a distance less than the twisted length.

17. The apparatus of claim 15, wherein at least one of:
    wherein the conductive paste strand comprises a second portion located from at least one of the main through hole or the secondary through hole by less than 20 mm; or
    wherein the conductive paste strand comprises a third portion surrounding at least one of the main electronic substrate or the secondary electronic substrate.

18. The apparatus of claim 6, wherein:
    the attachment of the main electronic substrate to the supporting frame is solely provided by the at least one main projecting tab when the at least one main projecting tab is in its twisted position, and
    the attachment of the secondary electronic substrate to the supporting frame is solely provided by the at least one secondary projecting tab when the at least one secondary projecting tab is in its twisted position.

19. A system comprising:
    a camera for a vehicle, the camera having:
    at least one electric or electronic component or circuit;
    a supporting frame having at least one main projecting tab that can be in a non-twisted position or a twisted position; and
    a main electronic substrate coupled to the supporting frame and provided for supporting the at least one electric or electronic component or circuit,
    the at least one main projecting tab, when in the twisted position, providing an attachment of the main electronic substrate to the supporting frame
    wherein:
    an electronic device further comprises a main cover part, and
    the at least one main projecting tab, when in the non-twisted position, interferes with the main cover part to prevent an assembly operation of adding the main cover part to the electronic device.

* * * * *